United States Patent
Ikedo et al.

(10) Patent No.: US 11,904,401 B2
(45) Date of Patent: Feb. 20, 2024

(54) PLASMA PROCESSING MACHINE

(71) Applicant: FUJI CORPORATION, Chiryu (JP)

(72) Inventors: Toshiyuki Ikedo, Nagoya (JP); Takahiro Jindo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 889 days.

(21) Appl. No.: 16/962,428

(22) PCT Filed: Jan. 30, 2018

(86) PCT No.: PCT/JP2018/003026
§ 371 (c)(1),
(2) Date: Jul. 15, 2020

(87) PCT Pub. No.: WO2019/150447
PCT Pub. Date: Aug. 8, 2019

(65) Prior Publication Data
US 2021/0076480 A1 Mar. 11, 2021

(51) Int. Cl.
*B23K 10/02* (2006.01)
*H01J 37/32* (2006.01)
*H05H 1/34* (2006.01)

(52) U.S. Cl.
CPC .......... *B23K 10/02* (2013.01); *H01J 37/3244* (2013.01); *H05H 1/3423* (2021.05)

(58) Field of Classification Search
None
See application file for complete search history.

(56) References Cited

U.S. PATENT DOCUMENTS

| 3,966,235 | A | 6/1976 | Lewis | |
|---|---|---|---|---|
| 4,168,822 | A | 9/1979 | Ogden | |
| 9,079,265 | B2 * | 7/2015 | Reinke | H05H 1/3423 |
| 10,950,420 | B2 * | 3/2021 | Jindo | H01J 37/3299 |
| 11,412,606 | B2 * | 8/2022 | Takikawa | H05H 1/3494 |
| 11,470,711 | B2 * | 10/2022 | Jindo | H05H 1/48 |
| 11,684,995 | B2 * | 6/2023 | Zhang | H05H 1/3473 |
| | | | | 219/121.52 |
| 2001/0030541 | A1 * | 10/2001 | Fujita | H01T 19/00 |
| | | | | 324/455 |
| 2002/0088785 | A1 * | 7/2002 | Coughlin | B23K 9/0325 |
| | | | | 219/60 R |

(Continued)

FOREIGN PATENT DOCUMENTS

| DE | 10 2015 101 796 A1 | 8/2015 |
|---|---|---|
| GB | 1 426 155 A | 2/1976 |

(Continued)

OTHER PUBLICATIONS

International Search Report dated Mar. 13, 2018 in PCT/JP2018/003026 filed Jan. 30, 2018, citing documents AO-AQ therein, 2 pages.

*Primary Examiner* — Thor S Campbell
(74) *Attorney, Agent, or Firm* — Oblon, McClelland, Maier & Neustadt, L.L.P.

(57) ABSTRACT

A practical plasma processing machine is provided, in which attachment mechanism is provided for attaching plasma head to attachment section of a head moving device that moves the plasma head. Since the plasma head can be attached or detached, for example, it is easy to exchange it with a different type of plasma head, remove for maintenance, attaching after maintenance, or the like.

8 Claims, 9 Drawing Sheets

(56) References Cited

U.S. PATENT DOCUMENTS

| | | | | |
|---|---|---|---|---|
| 2006/0037947 | A1* | 2/2006 | Schneider | H05H 1/34 |
| | | | | 219/121.48 |
| 2006/0108333 | A1* | 5/2006 | Picard | B23K 26/0665 |
| | | | | 219/121.62 |
| 2009/0240368 | A1* | 9/2009 | Young, Jr. | B23K 31/10 |
| | | | | 219/69.1 |
| 2010/0044351 | A1* | 2/2010 | Reinke | B23K 10/02 |
| | | | | 219/121.36 |
| 2010/0155377 | A1* | 6/2010 | Lindsay | B23K 31/10 |
| | | | | 219/121.44 |
| 2012/0291436 | A1* | 11/2012 | Hirson | F01K 23/101 |
| | | | | 122/448.1 |
| 2014/0183171 | A1 | 7/2014 | Fongaro et al. | |
| 2015/0129563 | A1* | 5/2015 | Hodges | B23K 10/00 |
| | | | | 219/121.44 |
| 2015/0230317 | A1 | 8/2015 | Hayashi et al. | |
| 2015/0235827 | A1* | 8/2015 | Bazargan | H01J 49/0031 |
| | | | | 702/116 |
| 2016/0023295 | A1* | 1/2016 | Lambert | H05H 1/42 |
| | | | | 219/121.44 |
| 2017/0246703 | A1* | 8/2017 | Fagan | B23K 31/12 |
| 2018/0154475 | A1* | 6/2018 | Fagan | H01L 21/461 |
| 2019/0366426 | A1* | 12/2019 | Wang | B25J 11/0065 |
| 2021/0176852 | A1* | 6/2021 | Jindo | H01R 13/641 |
| 2022/0386444 | A1* | 12/2022 | Siewert | H05H 1/3423 |
| 2022/0386445 | A1* | 12/2022 | Siewert | H05H 1/3423 |
| 2022/0399096 | A1* | 12/2022 | Zucker | A61B 34/32 |

FOREIGN PATENT DOCUMENTS

| | | |
|---|---|---|
| JP | 3-114677 A | 5/1991 |
| JP | 5-53780 U | 7/1993 |
| JP | 8-39256 A | 2/1996 |
| JP | 2008-284580 A | 11/2008 |
| JP | 2016-38940 A | 3/2016 |
| WO | WO 2010/079792 A1 | 7/2010 |
| WO | WO 2013/041404 A2 | 3/2013 |

\* cited by examiner (a)          (b)

PLASMA PROCESSING MACHINE

TECHNICAL FIELD

The present application relates to a plasma processing machine for irradiating a workpiece with a plasma-converted gas to perform a treatment on a surface of the workpiece.

BACKGROUND ART

In the related art, there is a plasma processing machine that uses a plasma generating device as described in the following Patent Literature as a plasma head which is an irradiation head, moves the plasma head with respect to the workpiece by a head moving device, and performs a treatment (hereinafter, sometimes referred to as "plasma processing") on a surface of a workpiece with a plasma gas irradiated or emitted from the plasma head.

PATENT LITERATURE

Patent Literature 1: JP-A-2016-38940

BRIEF SUMMARY

Technical Problem

For the plasma processing, it is desirable to use different types of plasma heads depending on the shape of the workpiece, the degree of treatment, and the like, and it is also desirable to perform regular maintenance on the plasma heads. The present disclosure has been made in view of such circumstances, and an object thereof is to provide a practical plasma processing machine.

Solution to Problem

In order to solve the above problems, the plasma processing machine of the present disclosure includes a plasma head configured to generate a plasma gas and eject the plasma gas from a nozzle; a head moving device configured to move the plasma head; and an attachment mechanism for detachably attaching the plasma head to an attachment section of the head moving device.

Advantageous Effects

Since the plasma processing machine of the present disclosure is capable of attaching and detaching the plasma head, for example, it is easy to exchange with a different type of plasma head, remove for maintenance, attach after maintenance, or the like. That is, the plasma processing machine of the present disclosure is highly practical because of its versatility and convenience.

DESCRIPTION OF EMBODIMENTS

Hereinafter, a representative embodiment of the present disclosure will be described in detail as an example with reference to the drawings. The present disclosure can be implemented in various modes in which various changes and improvements are made based on the knowledge of a person skilled in the art in addition to the following examples.

First Example

[A] Overall Configuration of Plasma Irradiation Device

Figure 1:
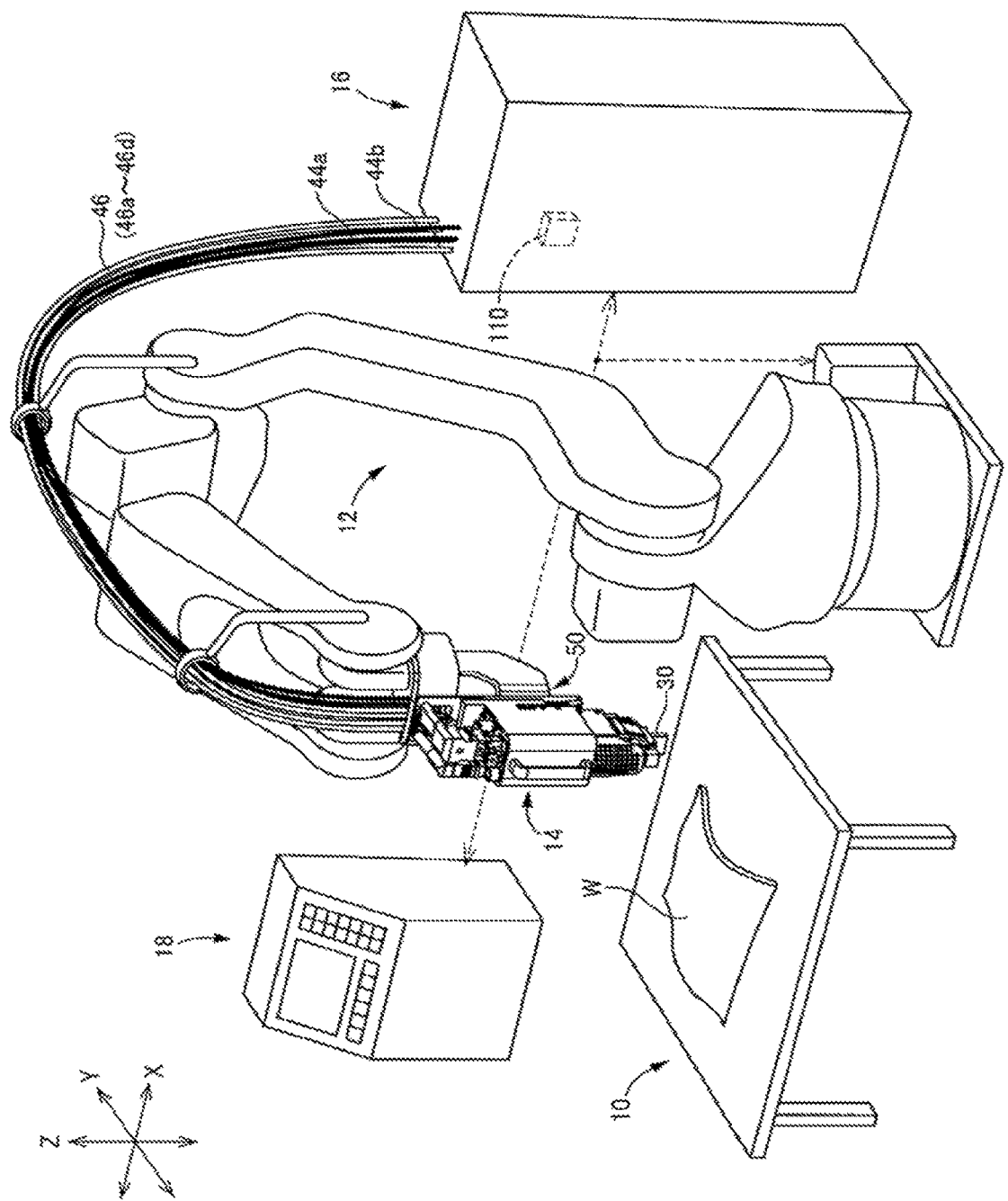
FIG. 1 is a diagram showing an overall configuration of a plasma processing machine according to a first example.

The plasma processing machine of the first example includes, as shown in FIG. 1, table 10 on which workpiece W is placed, serial link type robot (also referred to as an articulated robot, hereinafter, simply abbreviated as a "robot") 12 arranged beside table 10, plasma head 14 held by robot 12 emitting a plasma gas, power supply and gas supply unit 16 which supplies a power to plasma head 14 and supplies a gas to plasma head 14, and controller 18 as a control device for controlling the plasma processing machine. Incidentally, robot 12 functions as a head moving device for moving plasma head 14 to irradiate workpiece W with the plasma gas.

Figure 2:
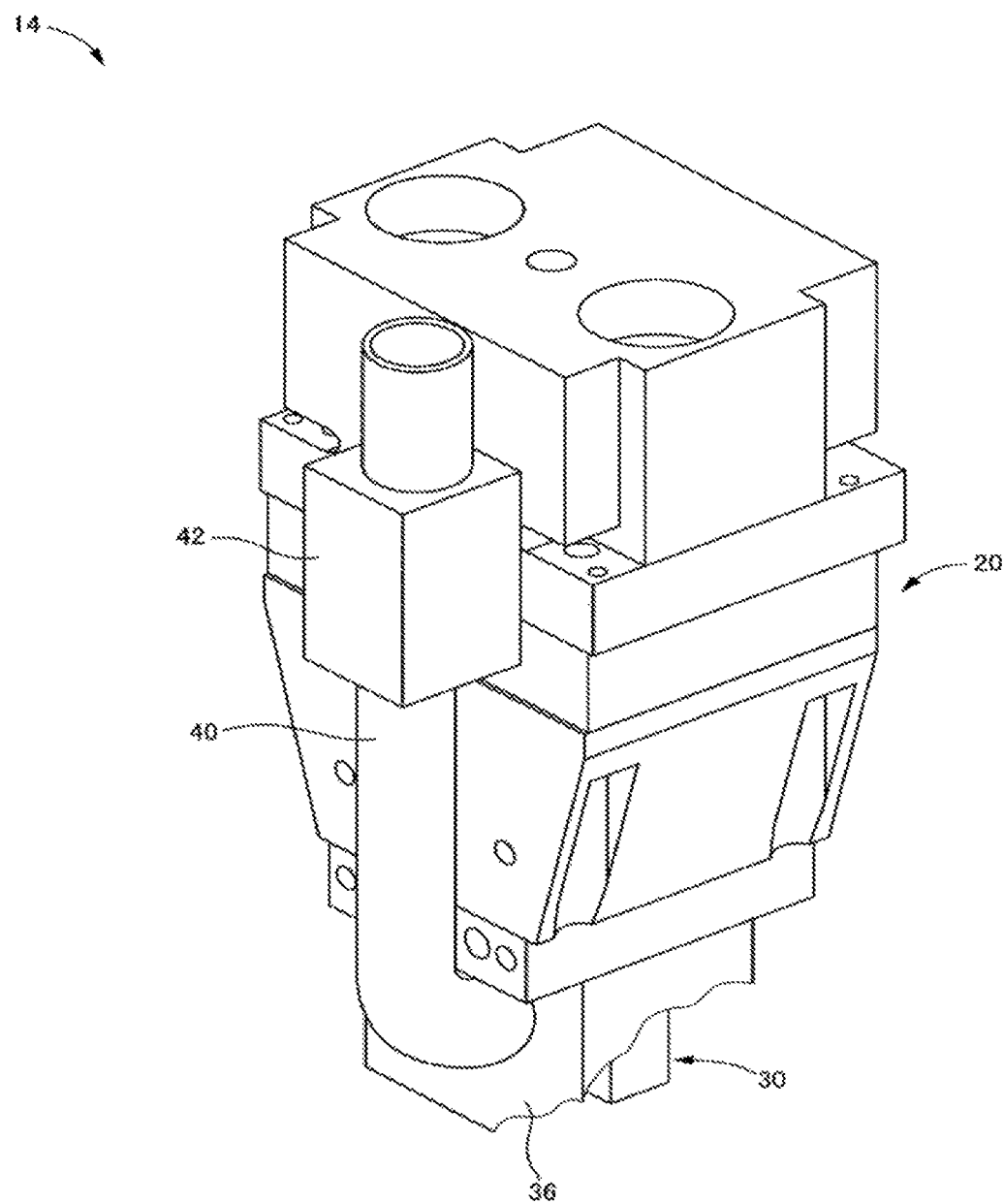
FIG. 2 is a perspective view showing a state in which a cover is removed from a plasma head of the plasma processing machine of the first example.
Figure 3:
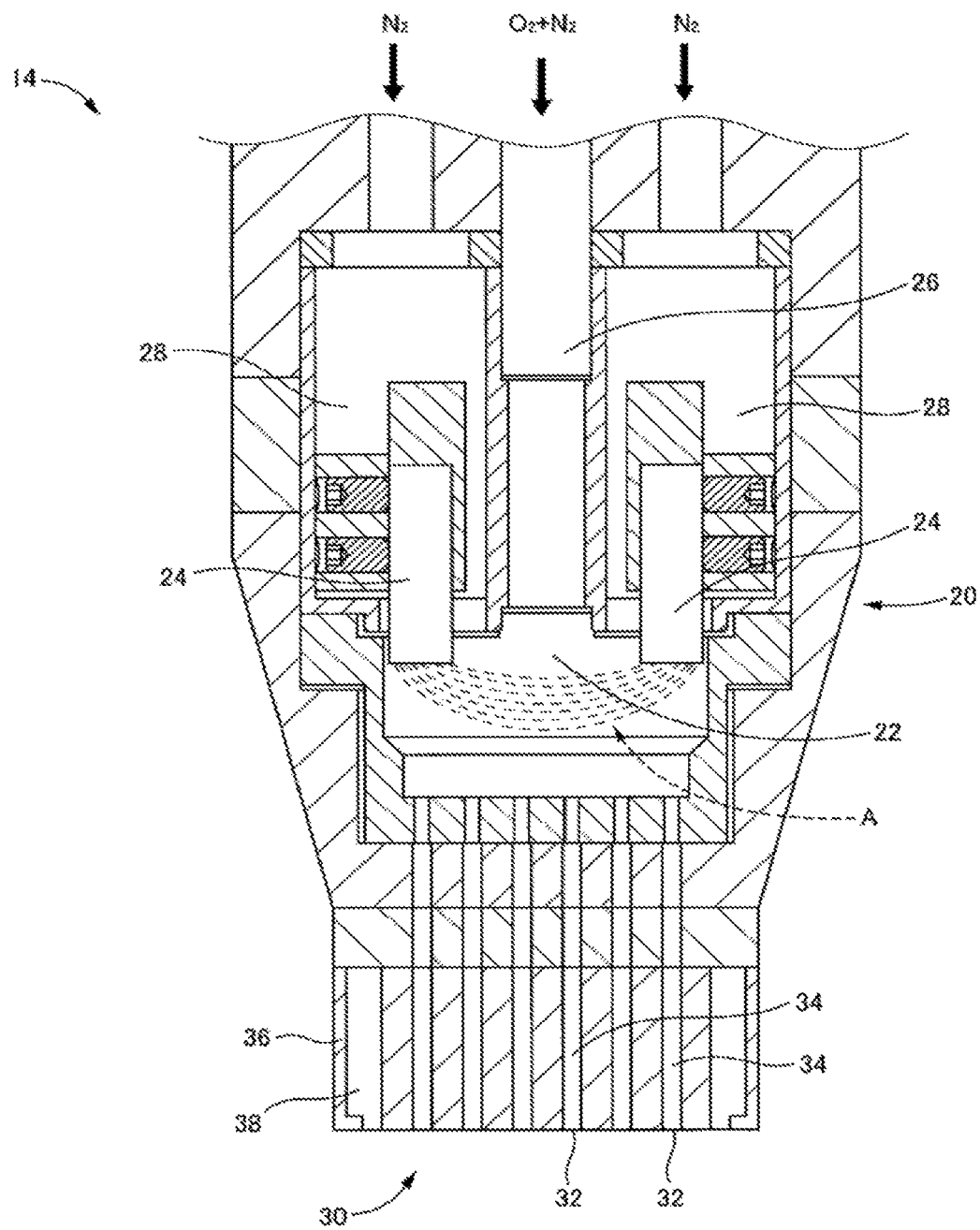
FIG. 3 is a sectional view of the plasma head of FIG. 2.

Referring to FIG. 2, which shows a state in which the cover is removed, and FIG. 3, which is a sectional view, plasma head 14 has housing 20 generally made of ceramics, and reaction chamber 22 for generating a plasma gas is formed in housing 20. A pair of electrodes 24 is held so as to protrude into reaction chamber 22. Reaction gas flow path 26 for allowing a reaction gas to flow into reaction chamber 22 from above and a pair of carrier gas flow paths 28 for allowing a carrier gas to flow in are formed in housing 20. The reaction gas (source gas) is oxygen ($O_2$), but from reaction gas flow path 26, a mixed gas of oxygen and nitrogen ($N_2$) (for example, dry air (air)) is caused to flow between electrodes 24 (hereinafter, this mixed gas is also referred to as "reaction gas" for convenience, and oxygen is sometimes referred to as "source gas" for convenience). The carrier gas is nitrogen and flows from respective carrier gas flow paths 28 so as to surround respective electrodes 24. The lower portion of plasma head 14 is nozzle 30, and nozzle 30 is configured with multiple emission ports 32 aligned in a line. Multiple emission passages 34 are formed so as to be connected to respective emission ports 32 downward from reaction chamber 22.

An AC voltage is applied between a pair of electrodes 24 by the power supply section of power supply and gas supply unit 16. By this application, for example, as shown in FIG. 3, pseudo arc A is generated between the lower ends of a pair of electrodes 24 in reaction chamber 22. When the reaction gas passes through pseudo arc A, the reaction gas is converted into plasma, and the plasma gas, which is the plasma-converted gas, is emitted (ejected) from nozzle 30 together with the carrier gas.

Around nozzle 30, sleeve 36 is provided so as to surround nozzle 30. A heat gas as a shield gas (in the present plasma processing machine, air is employed) is supplied to annular cavity 38 between sleeve 36 and nozzle 30 through supply pipe 40, and the heat gas is emitted along the flow of the plasma gas so as to surround the plasma gas emitted from nozzle 30. As the heat gas, as the name implies, heated gas is emitted to ensure the effect of the plasma gas. Therefore, in the middle of supply pipe 40, heater 42 for heating is provided.

Figure 4:
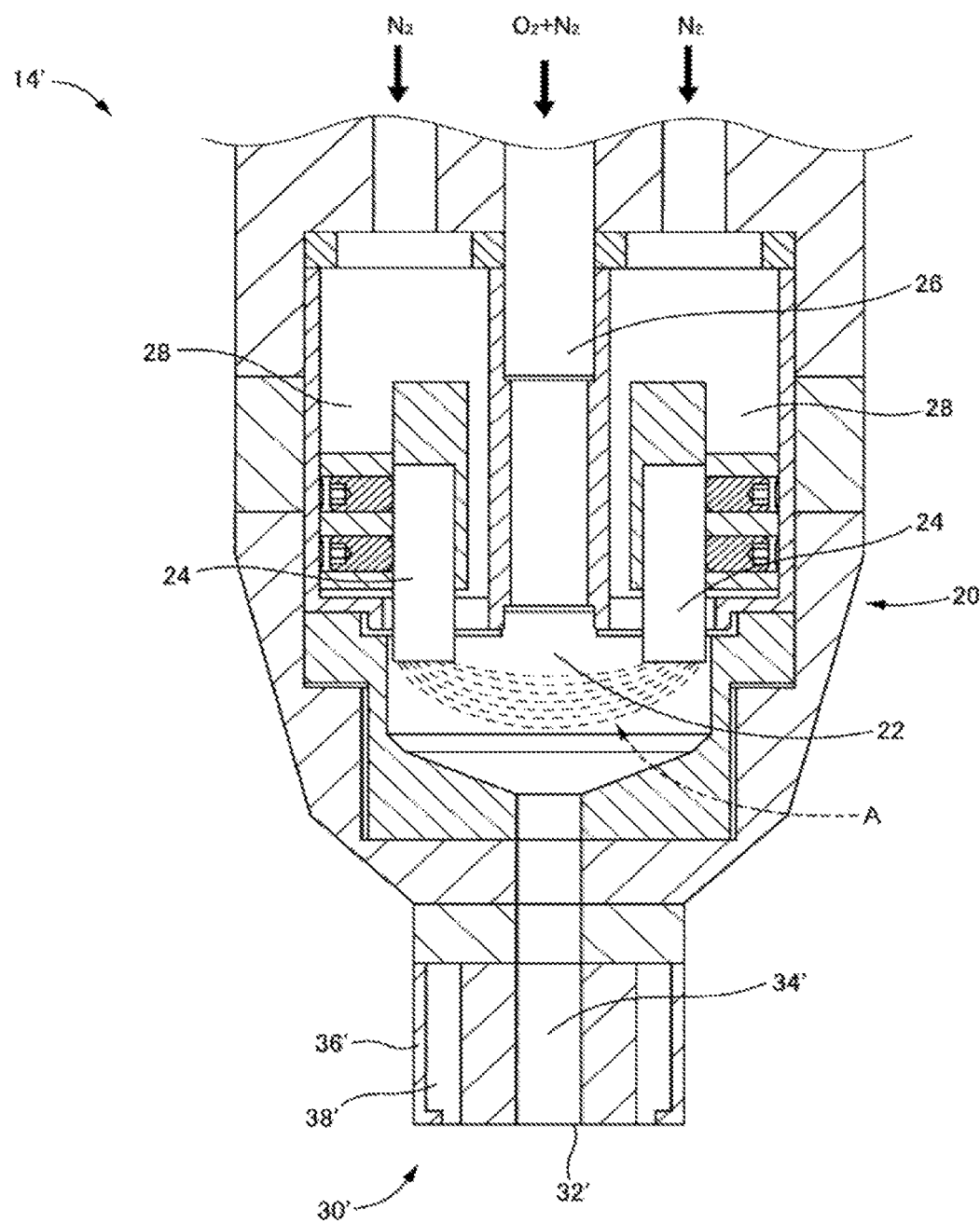
FIG. 4 is a sectional view showing another plasma head that can be employed in the plasma processing machine of the first example.

In the present plasma processing machine, another plasma head can be attached to robot 12 in place of plasma head 14 described above. FIG. 4 shows plasma head 14', which is an example of another plasma head. In plasma head 14' shown in the FIG. 4, one emission port 32' having a relatively large diameter is provided at nozzle 30', and one emission passage 34' is formed so as to be connected to emission port 32' downward from reaction chamber 22. Sleeve 36' and annular cavity 38' are modified to match nozzle 30'. The rest of the configuration is the same as that of plasma head 14, and therefore description thereof is omitted. Thus, the plasma processing machine can be mounted with different type of plasma head.

Although not shown, power supply and gas supply unit 16 includes a power supply section and a gas supply section. The power supply section has a power supply for applying a voltage between a pair of electrodes 24 of plasma head 14, and supplies electric power, for applying a voltage between electrodes 24, to plasma head 14 by wire (cable) 44a. A signal for control is also transmitted to plasma head 14 via wire (cable) 44b. The gas supply section supplies the above-mentioned reaction gas, carrier gas, and heat gas. The reaction gas is supplied to plasma head 14 through one gas tube 46a, the carrier gas is supplied through two gas tubes 46b and 46c, and the heat gas is supplied through one gas tube 46d. Incidentally, gas tubes 46a to 46d constitute pipelines for supplying the respective gases. In the following description, wires 44a and 44b and gas tubes 46a to 46d may be collectively referred to as wire 44 and gas tube 46, respectively.

[B] Attachment Mechanism of Plasma Head

Figure 5:
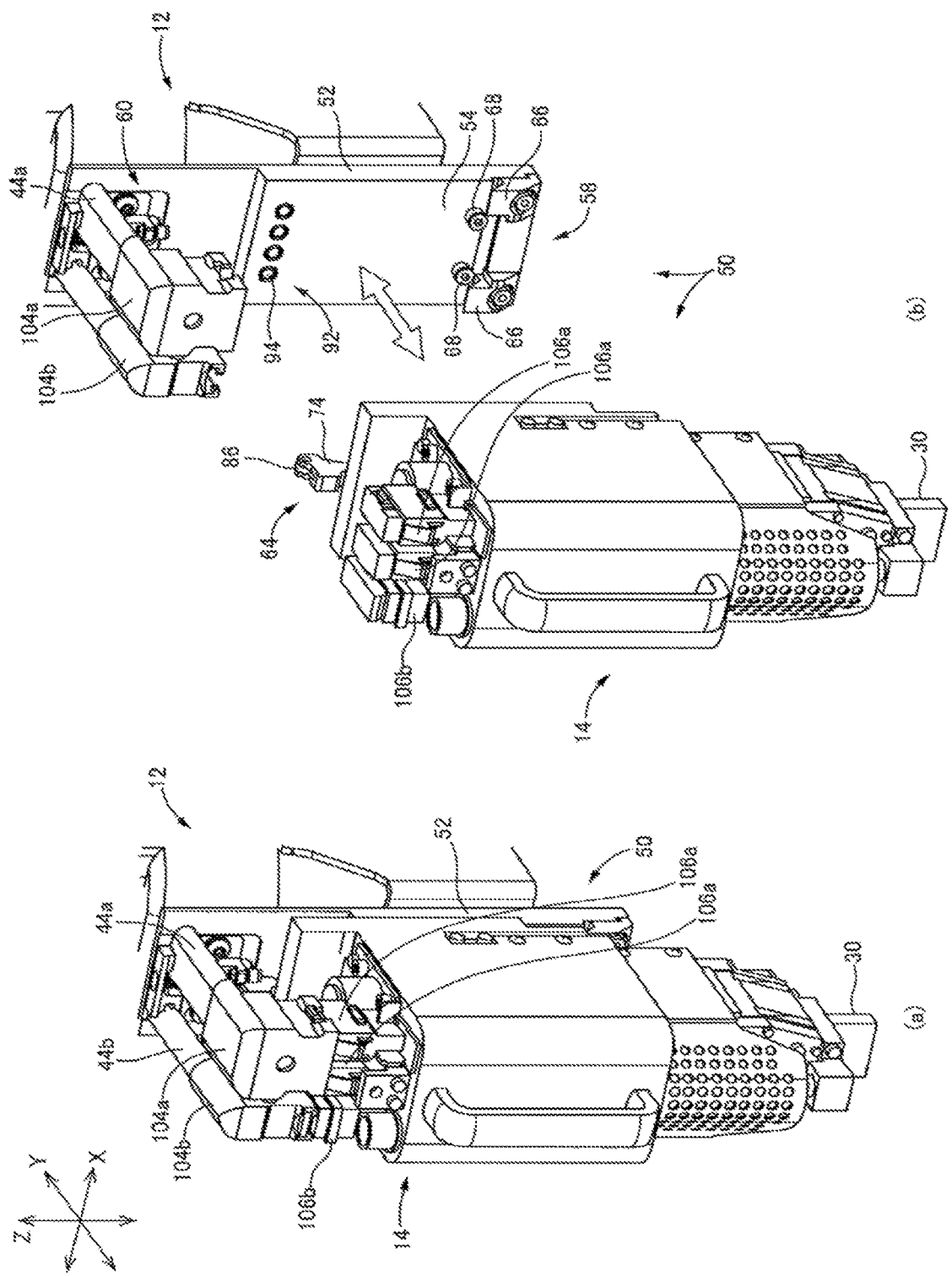
FIG. 5 is a diagram showing an image of attachment and detachment of the plasma head in the plasma processing machine of the first example.
Figure 6:
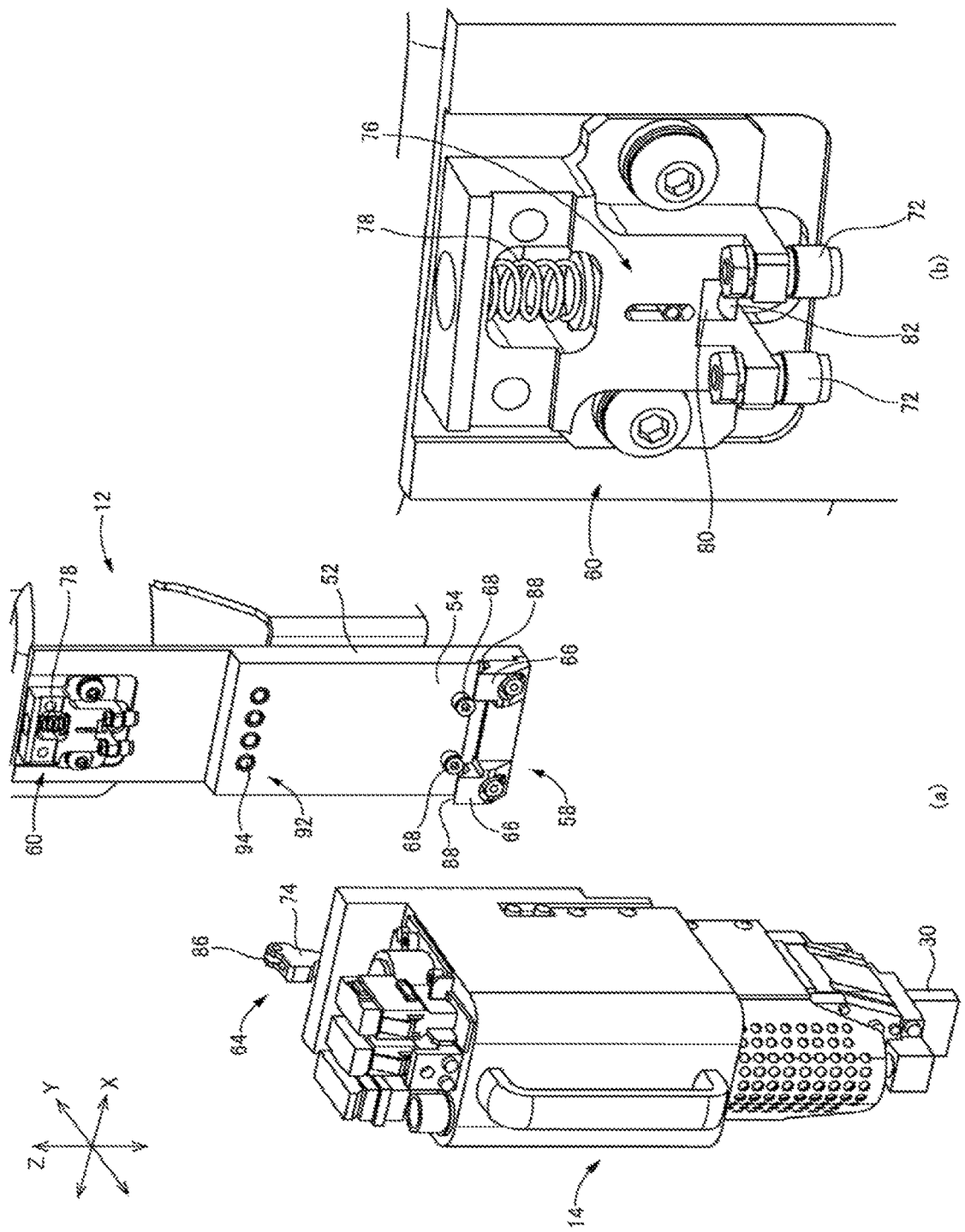
FIG. 6 is a diagram for explaining an attachment mechanism of the plasma head employed in the plasma processing machine of the first example.
Figure 7:
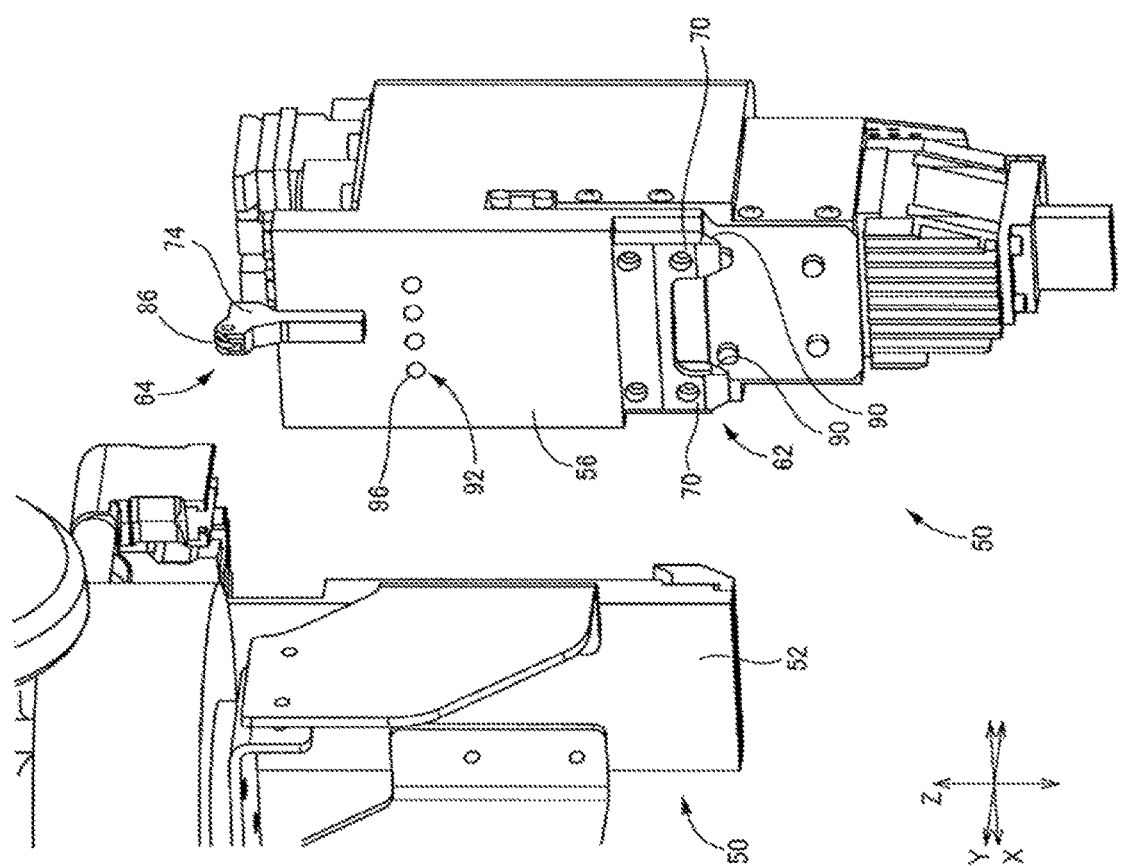
FIG. 7 is a diagram for explaining the attachment mechanism of the plasma head and is a diagram in a viewpoint opposite to that of FIG. 6.

In the present plasma processing machine, as shown in FIG. 5, attachment mechanism 50 for detachably attaching plasma head 14 with respect to robot 12 is provided. FIG. 5(a) shows a state in which plasma head 14 is attached by attachment mechanism 50, and FIG. 5(b) shows a state in which plasma head 14 is removed. FIG. 6 is a diagram in which a connector (described in detail later) for transmitting a signal for power supply and control to electrode 24 is omitted in order to explain attachment mechanism 50, FIG. 6(a) is an overall view of attachment mechanism 50, and FIG. 6(b) is an enlarged view of a second engaging section to be described later. FIG. 7 is a diagram showing a line of sight opposite to that shown in FIG. 6(a) for explaining attachment mechanism 50. Hereinafter, the attachment mechanism will be described with reference to these drawings.

Attachment mechanism 50 is a mechanism for attaching plasma head 14 to attachment section 52 provided in the robot. Attachment section 52 is provided with attaching surface 54 extending in the up-down direction, which is a first direction (Z-direction) and extending in the left-right direction (X-direction), which is a second direction perpendicular to the first direction. On the other hand, plasma head 14 is provided with attached surface 56 which comes into contact with attaching surface 54 in a state where plasma head 14 is attached, in other words, fitted to attaching surface 54. Attachment section 52 is provided with first engaging section 58 at one side portion in the up-down direction, that is, the lower portion, and is provided with second engaging section 60 at the other side of the portion, that is, the upper portion. Briefly, first engaging section 58 and second engaging section 60 are provided so as to sandwich attaching surface 54. In contrast, plasma head 14 is provided with first engaged section 62 to be engaged with first engaging section 58 and second engaged section 64 to be engaged with second engaging section 60.

First engaging section 58 has a pair of receiving sections 66 and a pair of rollers 68, each of which is disposed spaced apart from each other in the left-right direction. On the other hand, first engaged section 62 has a pair of legs 70 which are disposed spaced apart from each other in the left-right direction. In a state in which plasma head 14 is attached, that is, in a state in which first engaging section 58 and first engaged section 62 are engaged, a pair of receiving sections 66 locks the lower end of a pair of legs 70 and prohibits plasma head 14 from being displaced downward with respect to attachment section 52. Further, in that state, by the outer peripheral surface of a pair of rollers 68 abutting on the inner surface of a pair of legs 70 (surfaces facing each other), respectively, a pair of rollers 68 prohibits plasma head 14 from being displaced in the left-right direction with respect to attachment section 52. In other words, a pair of rollers 68 and a pair of legs 70 constitute a second-direction displacement prohibiting mechanism for prohibiting the displacement of plasma head 14 in the second direction by prohibiting the displacement of first engaged section 62 in the second direction.

Figure 8:
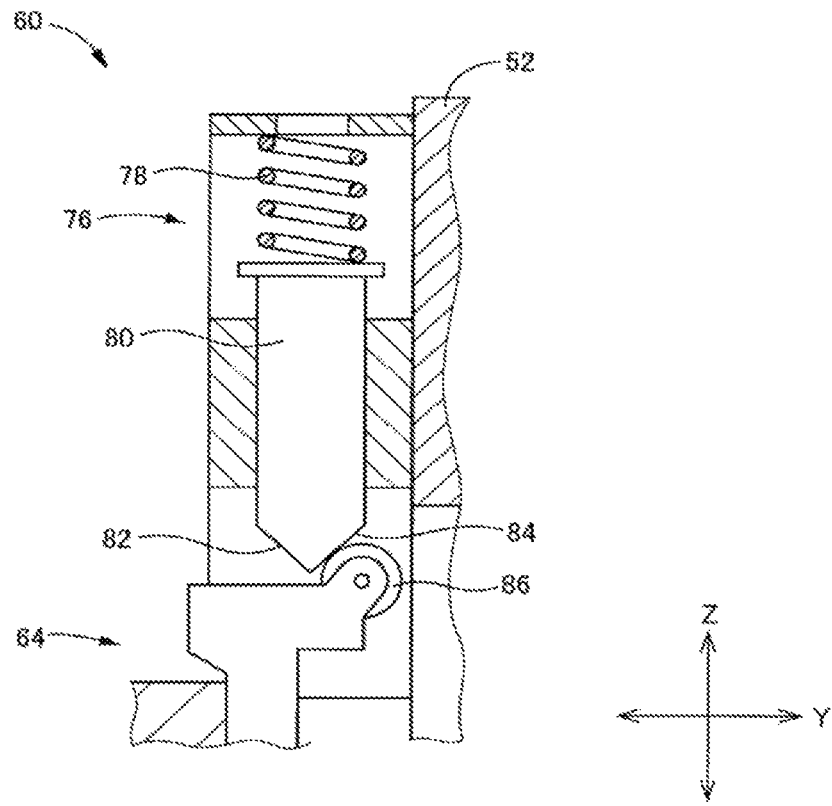
FIG. 8 is a sectional view showing a biasing mechanism included in the attachment mechanism of FIGS. 6 and 7.

Second engaging section 60 has a pair of rollers 72, while second engaged section 64 has gripped section 74 that is gripped by a pair of rollers 72 in a state of being engaged with second engaging section 60. A pair of rollers 72 and gripped section 74 constitute a second-direction displacement prohibiting mechanism for prohibiting the displacement of plasma head 14 in the second direction together with a pair of rollers 68 and a pair of legs 70 by prohibiting the displacement of second engaged section 64 in the second direction. Further, biasing mechanism 76 is provided at second engaging section 60. Specifically described with reference to FIG. 8 showing a cross section of second engaging section 60, second engaging section 60 has plunger 80 which is biased downward in the first direction by spring 78, and the lower end portion of plunger 80 has a pair of inclined surfaces 82 and 84. On the other hand, second engaged section 64 has roller 86, and in a state in which second engaged section 64 is engaged with second engaging section 60, roller 86 is engaged with inclined surface 84 positioned on the rear side in a third direction perpendicular to the first direction and the second direction, that is, the front-rear direction (Y-direction). Due to the biasing force of spring 78, plunger 80 biases roller 86 downwardly. In other words, biasing mechanism 76 has a function of biasing plasma head 14 downward, which is one side in the first direction.

By engaging inclined surface 84 and roller 86, second engaged section 64 of plasma head 14 is biased rearward by the biasing force of biasing mechanism 76. Further, at the lower ends of a pair of receiving sections 66 and a pair of legs 70 of first engaged section 62 of first engaging section 58 described above, inclined surface 88 and inclined surface 90 which engage with each other are provided respectively, and first engaged section 62 is also biased rearward by the biasing force of biasing mechanism 76. Therefore, in the present plasma processing machine, entire plasma head 14 is biased rearward by the biasing force of biasing mechanism 76, so that attaching surface 54 of attachment section 52 and attached surface 56 of plasma head 14 are fitted together exactly.

Figure 9:
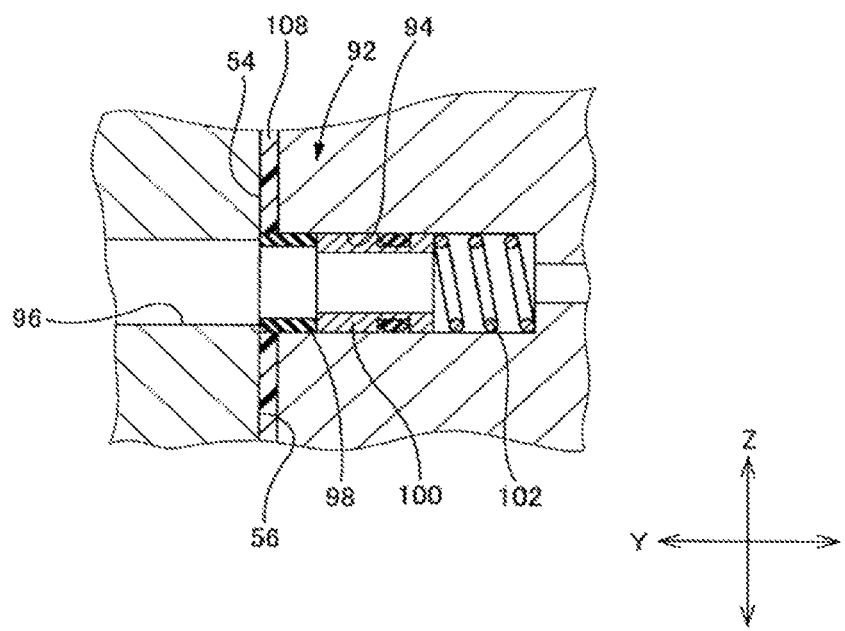
FIG. 9 is a sectional view showing a structure of a connector for connecting a pipeline for supply of gas between the plasma head and an attachment section.

Although not shown in detail in the drawings, gas tube 46 for the supply of each gas described above is connected to the rearward portion of attachment section 52. The connection of the pipeline connecting each gas tube 46 to plasma head 14 is performed by each of four connectors 92 which are gas connectors in the state where plasma head 14 is attached to attachment section 52. Referring to FIG. 9 as well, attaching surface 54 is provided with four supply holes 94 corresponding to four connectors 92. Further, attached surface 56 is provided with four receiving holes 96 provided at positions that respectively match four supply holes 94. Four connectors 92 have the same structure each other. Explaining one connector 92, supply hole 94 contains short rubber pipe 98, sleeve 100 that supports short rubber pipe 98 and has a sealed outer periphery, and spring 102 for biasing sleeve 100 forward. If plasma head 14 is not attached, although the tip end of rubber pipe 98 protrudes from attaching surface 54, but when plasma head 14 is attached, that is, in a state where attaching surface 54 and attached surface 56 are in contact with each other, rubber pipe 98 retreats against the biasing force of spring 102, and supply hole 94 and receiving hole 96 are connected while being sealed. That is, attachment mechanism 50 is configured to include four connectors 92 for connecting the pipeline for the supply of gas, and each connector 92 is configured to include supply hole 94, receiving hole 96, rubber pipe 98, sleeve 100, spring 102, or the like.

Referring to FIG. 5, wire 44a for supplying electric power to electrode 24 of plasma head 14 and wire 44b for sending a control signal extend to the front side at the upper portion of attachment section 52, and connectors 104a and 104b are provided at the tip ends of wires 44a and 44b, respectively. Connectors 104a and 104b constitute attachment mechanism 50, and are connected to connectors 106a and 106b provided at plasma head 14 after plasma head 14 is attached.

As can be seen from FIG. 9, insulating layer 108 is formed on the surface of attaching surface 54. Rollers 68, 72, and 86 are made of resin, and first engaged section 62 is also made of resin. Accordingly, in a state in which plasma head 14 is attached to attachment section 52 by attachment mechanism 50, plasma head 14 are electrically insulated from attachment section 52. Inside power supply and gas supply unit 16, in order to detect disconnection, leakage, or the like, current sensor 110 (see FIG. 1) for measuring the current supplied through wire 44a is disposed. By the insulation, noise from plasma head 14 via robot 12 is effectively prevented from adversely affecting the current measurement of current sensor 110.

To attach plasma head 14 to attachment section 52 using attachment mechanism 50, first, first engaged section 62 may be locked to first engaging section 58 from obliquely upward and second engaged section 64 may be moved to the rear side in the third direction with respect to second engaging section 60 by pushing the upper portion of plasma head 14 rearward in the locked state to engage second engaged section 64 with second engaging section 60. By such an operation, plasma head 14 is attached in a state where attaching surface 54 and attached surface 56 are fitted together exactly. When removing attached plasma head 14, the reverse operation may be performed. Specifically, after pulling the upper portion of plasma head 14 forward to separate attached surface 56 from attaching surface 54, plasma head 14 may be lifted obliquely upward. Thus, by using attachment mechanism 50, with one touch, plasma head 14 can be attached to and detached from attachment section 52. Same attachment mechanism 50 is also employed in another plasma head 14'. The present plasma processing machine is excellent in versatility because it can be easily exchanged with a different type of plasma head, and is also excellent in convenience because maintenance of the plasma head can be easily performed.

Second Example

The plasma processing machine of the second example employs attachment mechanism 50 of the same structure in attachment to attachment section 52 of the plasma head, but is different in feeding the electrodes of the plasma head, and differs in the connection of wires for supplying power to the electrodes of the plasma head and transmitting control signals, and connection of gas tubes for supplying of each gas to the plasma head.

Figure 10:
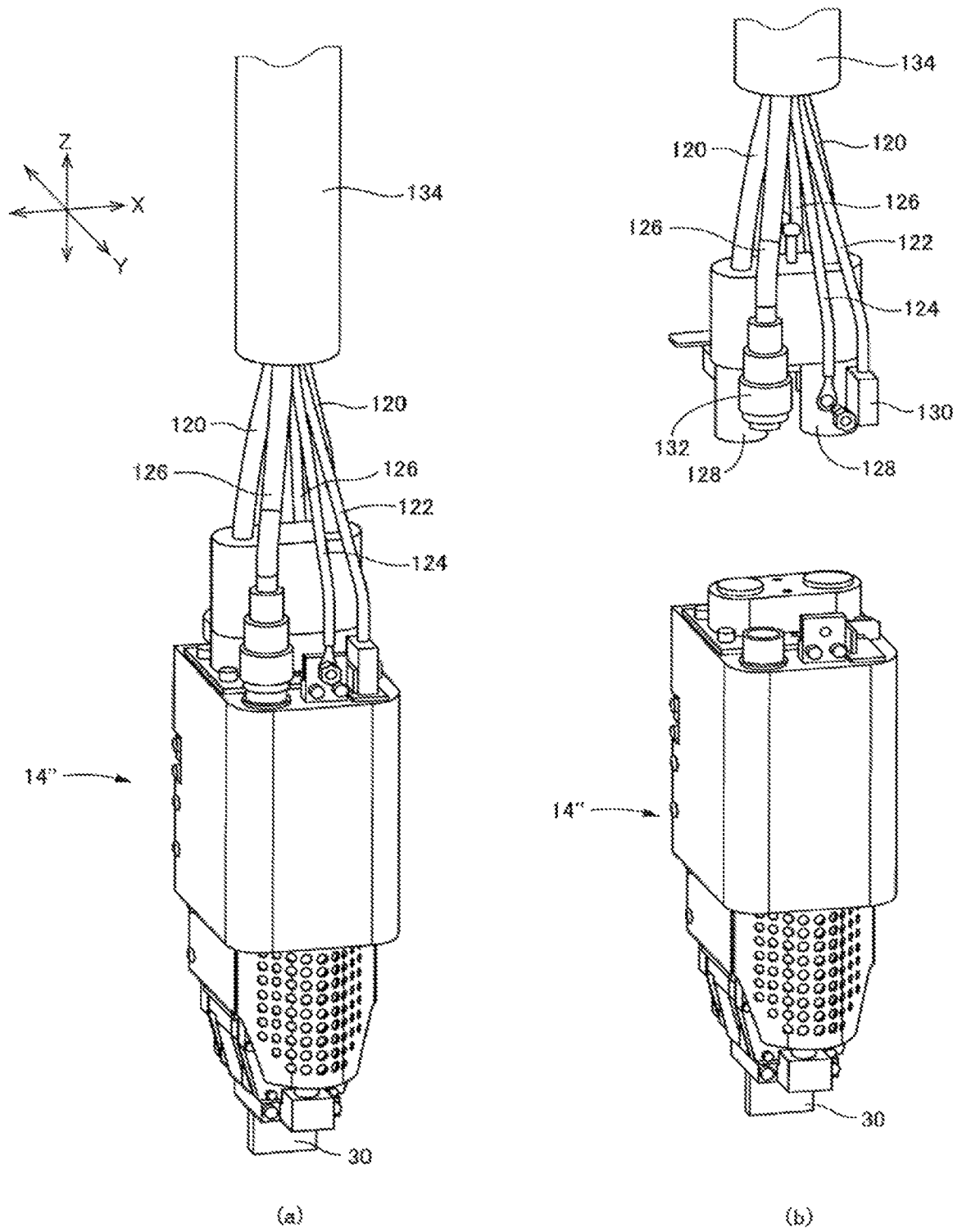
FIG. 10 is a diagram showing a plasma head employed in a plasma processing machine of a second example.

Referring to FIG. 10(a) showing a state in which the wire and the gas tube are connected, and FIG. 10 (b) showing a state in which the connection is released, in plasma head 14" in the second example (internal structure is the same as plasma head 14 in the first example), wire 120 for supplying power to electrode 24, wire 122 for transmitting a control signal, wire 124 for ground, and gas tubes 126 (only two are shown in the drawings) for supplying each gas are connected to plasma head 14" are connected at the upper portion not without using attaching surface 54 and attached surface 56. Wire 120, wire 122, and gas tube 126 are connected using connectors 128, 130, and 132, respectively. After attaching plasma head 14" to attachment section 52, their connections are made. When removing plasma head 14", plasma head 14" is disconnected from attachment section 52 after the connection is released. Incidentally, wire 120, wire 122, wire 124, and gas tube 126 are inserted through cover tube 134 and are connected to a power supply and gas supply unit in a form of one relatively thick string.

In the plasma processing machine of the second example, in a state in which plasma head 14" is attached, wires 120 to 124 and gas tube 126 are arranged to extend from the upper portion of plasma head 14 to the upper side which is one side in the first direction (X-direction). Accordingly, the plasma processing machine of the second example can easily perform maintenance related to the pipeline, power supply, and the like in the supply of gas, and the attachment and detachment of plasma head 14" including the attachment and detachment of gas tube 126 and wires 120 to 124 can be easily performed together with the adoption of an attachment mechanism similar to that of the plasma processing machine of the first example.

REFERENCE SIGNS LIST

10: table, 12: serial link type robot [head moving device], 14, 14', 14": plasma head, 16: power supply and gas supply unit, 44a, 44b: wire, 46a to 46d: gas tube, 50: attachment mechanism, 52: attachment section, 54: attaching surface, 56: attached surface, 58: first engaging section, 60: second engaging section, 62: first engaged section, 64: second engaged section, 76: biasing mechanism, 92: connector, 104a, 104b: connector, 106a, 106b: connector, 108: insulating layer, 120 to 124: wire, 126: gas tube

The invention claimed is:

1. A plasma processing machine comprising:
    a plasma head configured to generate a plasma gas and eject the plasma gas from a nozzle;
    a head moving device configured to move the plasma head; and
    an attachment mechanism for detachably attaching the plasma head to an attachment section of the head moving device, the attachment mechanism including:
        a first engaging section is configured to lock a first engaged section so as to prohibit displacement of the plasma head with respect to the attachment section to one side in a first direction, and
        a second engaging section that has a biasing mechanism that biases a second engaged section toward the one side in the first direction.

2. The plasma processing machine according to claim 1, wherein the attachment mechanism includes:
    an attaching surface provided at the attachment section and extending in the first direction and a second direction perpendicular to the first direction,
    an attached surface provided at the plasma head and coming into contact with the attaching surface in a state in which the plasma head is attached,
        the first engaging section provided at a portion on one side of the attachment section in the first direction, and the second engaging section provided at a portion on an other side, and
        the first engaged section engaging with the first engaging section and the second engaged section engaging with the second engaging section, the first and the second engaged sections being provided at the plasma head, and
    the plasma processing machine further comprising:
        a second-direction displacement prohibiting mechanism configured to prohibit displacement of the plasma head in the second direction in a state in which the first engaging section and the first engaged section are engaged and the second engaging section and the second engaged section are engaged.

3. The plasma processing machine according to claim 2, wherein the attachment mechanism is configured to complete attachment of the plasma head by moving the plasma head such that the second engaged section is moved in a third direction that intersects both the first direction and the second direction in a state in which the first engaged section is locked to the first engaging section, and bringing the attached surface into contact with the attaching surface to engage the second engaged section with the second engaging section.

4. The plasma processing machine according to claim 2, wherein the second-direction displacement prohibiting mechanism is configured to prohibit displacement of at least the first engaged section in the second direction in a state in which the first engaged section is locked to the first engaging section.

5. The plasma processing machine according to claim 2, wherein the attachment mechanism includes a gas connector for connecting a pipeline for supplying gas to the plasma head in a state in which the attaching surface and the attached surface are in contact with each other.

6. The plasma processing machine according to claim 1, wherein a wire for supplying electric power to the plasma head in a state in which the plasma head is attached to the attachment section extends from the attachment section, and
the attachment mechanism includes a connector provided at a tip end of the wire for connecting the wire to the plasma head.

7. The plasma processing machine according to claim 1, wherein the attachment mechanism includes:
    an attaching surface provided at the attachment section and extending in a first direction and a second direction perpendicular to the first direction, and
    an attached surface provided at the plasma head and coming into contact with the attaching surface in a state in which the plasma head is attached,
    the attachment mechanism is configured to attach the plasma head so that the attached surface is fitted with the attaching surface, and remove the plasma head such that the attached surface is separated from the attaching surface, and
the plasma processing machine includes a tube extending from the plasma head in the first direction for supplying gas to the plasma head and a wire extending from the plasma head in the first direction for supplying electric power to the plasma head in a state in which the plasma head is attached to the attachment section.

8. The plasma processing machine according to claim 1, wherein the attachment mechanism is configured to electrically insulate the plasma head from the attachment section in a state in which the plasma head is attached to the attachment section.

* * * * *